United States Patent
Peckham et al.

(10) Patent No.: US 6,195,536 B1
(45) Date of Patent: *Feb. 27, 2001

(54) IMPEDANCE MATCHING FOR A DUAL BAND POWER AMPLIFIER

(75) Inventors: David Sutherland Peckham, Barrington Hills; Gregory Redmond Black, Vernon Hills, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/562,733

(22) Filed: May 1, 2000

Related U.S. Application Data

(62) Division of application No. 08/802,831, filed on Feb. 19, 1997, now Pat. No. 6,078,794.

(51) Int. Cl.[7] .................................................. H01Q 11/12
(52) U.S. Cl. ............................................. 455/127; 333/32
(58) Field of Search ........................... 455/93, 114, 115, 455/126, 127, 129, 341; 330/51, 286, 306, 279; 333/32, 33

(56) References Cited

U.S. PATENT DOCUMENTS

| | | | |
|---|---|---|---|
| 4,723,306 | * | 2/1988 | Fuenfgelder et al. . |
| 4,959,873 | * | 9/1990 | Flynn et al. . |
| 5,060,294 | * | 10/1991 | Schwent et al. . |
| 5,361,403 | * | 11/1994 | Dent . |
| 5,406,224 | * | 4/1995 | Mikami et al. . |
| 5,423,074 | * | 6/1995 | Dent . |
| 5,432,473 | * | 7/1995 | Mattila et al. . |
| 5,455,968 | * | 10/1995 | Pham . |
| 5,530,923 | * | 6/1996 | Heinonen et al. . |
| 5,532,646 | * | 7/1996 | Aihara . |
| 5,748,042 | * | 5/1998 | Norris et al. . |
| 5,774,017 | * | 6/1998 | Adar . |

FOREIGN PATENT DOCUMENTS

| | | | |
|---|---|---|---|
| 0 459 440 B1 | * | 9/1996 | (EP) . |
| 2 236 028 | * | 3/1991 | (GB) . |
| 2 260 871 | * | 4/1993 | (GB) . |

* cited by examiner

*Primary Examiner*—Reinhard Eisenzopf
*Assistant Examiner*—Sam Bhattacharya
(74) *Attorney, Agent, or Firm*—Sylvia Chen; Roland K. Bowler, II

(57) ABSTRACT

An exciter matching circuit (125), interstage matching circuit (134), and harmonic filter matching circuit (140) match impedances at the input to a two-stage power amplifier (130), between the first stage (132) and the second stage (136) of the power amplifier (130), and at the output of the power amplifier (130) for more than one frequency band of interest. In a GSM/DCS dual band radiotelephone (101), the matching circuits (124, 134, 140) provide low return loss at 900 MHz when the dual band transmitter (110) is operating in the GSM mode. The harmonic filter matching circuit (140) also filters out signals at 1800 MHz, 2700 MHz, and high order harmonics. When the dual band transmitter (110) is in DCS mode, however, the matching circuits (124, 134, 140) provide a low return loss at 1800 MHz and filter out signals at 2700 MHz and harmonics of 1800 MHz.

11 Claims, 5 Drawing Sheets

140

IMPEDANCE MATCHING FOR A DUAL BAND POWER AMPLIFIER

CROSS REFERENCE TO RELATED APPLICATION

This patent application is a division of U.S. patent application Ser. No. 08/802,831 filed Feb. 19, 1997 by David S. Peckham et al., now U.S. Pat. No. 6,078,794 and entitled "Impedance A Matching for a Dual-Band Power Amplifier." This related application is hereby incorporated by reference herein in its entirety, and priority thereto for common subject matter is hereby claimed.

FIELD OF THE INVENTION

This invention relates generally to dual band communication systems, and more particularly to impedance matching circuits for a power amplifier in a dual band transmitter.

BACKGROUND OF THE INVENTION

A dual mode transmitter can operate using two different systems. For example, an AM/FM dual mode transmitter can transmit both amplitude modulated and frequency modulated signals. For radiotelephones, a dual band transmitter can operate using two different cellular telephone systems. For example, a dual band GSM/DCS radiotelephone can use the Global System for Mobile Communications (GSM), which operates at 900 MHz, and the Digital Communications System (DCS), which is similar to GSM except that it operates at 1800 MHz.

In any radiotelephone, the power amplifier at the final stage of the transmitter should be matched to the impedance of the antenna. Additionally, harmonics of the transmitted frequency band should be suppressed to reduce interference with other communication systems operating at the harmonic frequencies. With a GSM/DCS dual band transmitter, it is difficult to suppress the first (1800) MHz harmonic during 900 MHz GSM transmissions and yet pass the 1800 MHz signal during DCS transmissions. Also the output impedance of a radiotelephone power amplifier should be matched to the antenna so that the impedance at the output of the amplifier is at the optimum impedance for power efficient amplification.

Thus, there is a need for a dual band power amplifier that can suppress harmonic frequencies during a first mode of transmission and also properly pass signals during a second mode of transmission, even when the signals of the second transmission are at or near a harmonic frequency of the first mode of transmission. There is also a need for a dual mode power amplifier with a limited number of parts and a low current drain.

DETAILED DESCRIPTION OF THE PREFERRED EMBODIMENT

Three matching circuits enable a modulator, power amplifier, and antenna of a radiotelephone transmitter to efficiently amplify and transmit signals at more than one frequency band while suppressing first, second, and higher order harmonics. An exciter matching circuit matches the impedance at the output of the modulator to the impedance at the input of the power amplifier for both modes of a dual band transmitter. An interstage matching circuit has a switch to match impedances between a first stage and a second stage of a power amplifier during different bands of operation. Finally, a harmonic filter matching circuit uses a switch to match impedances and adjust the filter pass band of a combined filter and matching circuit during different modes of operation.

Figure 1:
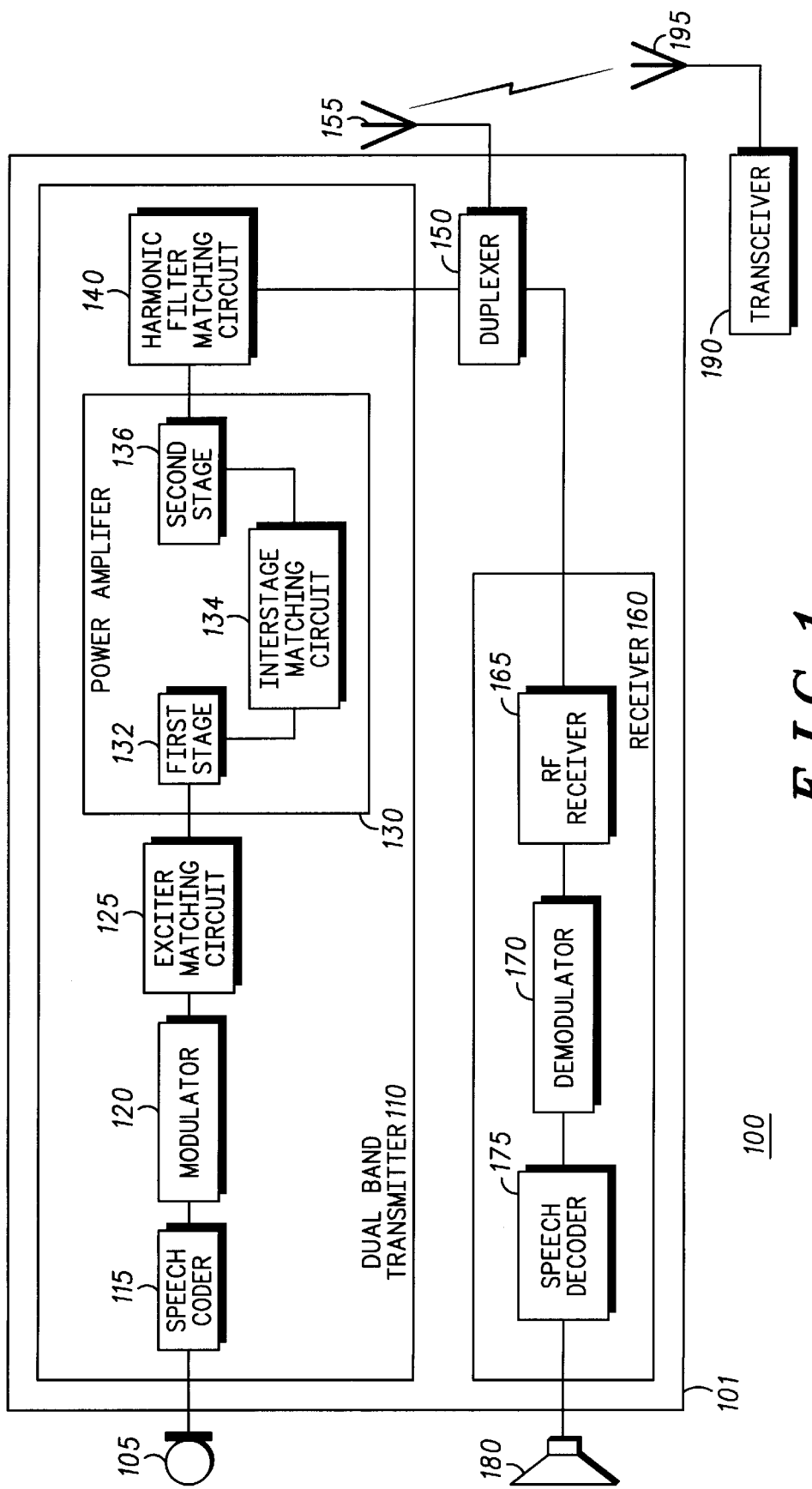
FIG. 1 shows a diagram of a communication system having matching circuits according to a preferred embodiment.

FIG. 1 shows a diagram of a communication system 100 having matching circuits 125, 134, 140 according to a preferred embodiment. The communication system 100 shown is a cellular communication system with a handset radiotelephone 101 and a base station transceiver 190, however, a different communication system could be substituted, such as a modulator/demodulator (MODEM), a paging system, or a two-way radio system. The radiotelephone 101 is a dual band GSM/DCS radiotelephone, however, other transmission modes with constant envelope modulation schemes can be substituted for either the GSM mode, the DCS mode, or both modes. Other constant envelope modulation communication systems include Advanced Mobile Phone Service (AMPS) and ETACS (European Total Access Cellular System), which use frequency modulation (FM), and Personal Communication System (PCS) 1900 which uses Gaussian Minimum Shift Keying (GMSK) as does GSM and DCS. Transmission modes may also be added to create a tri-mode or quad-mode radiotelephone.

The radiotelephone 101 includes a microphone 105 for picking up audio signals. In a dual band transmitter 110, the audio signals are coded by a speech coder 115 and sent to a modulator 120. Depending on the mode in use, the modulator 120 mixes the coded signals to 900 MHz in the case of GSM or 1800 MHz in the case of DCS. An exciter matching circuit 125 includes a bipolar junction transistor (BJT) and matches the approximately 50 Ω impedance at the BJT output to the approximately 7 Ω impedance at the power amplifier 130 input for the frequency bands of interest, which is either at 900 MHz or 1800 MHz depending on the mode in use. Power amplifier 130 is preferably a gallium arsenide (GaAs) field-effect transistor (FET) two-stage amplifier with a first stage 132 and a second stage 136. Other device types, however, such as silicon BJTs or silicon FETs could be substituted for the GaAs FETs. Between the two stages is an interstage matching circuit 134 that optimizes the impedance matching at either 900 MHz or 1800 MHz depending on the mode in use. At the output of the power amplifier 130, which has an impedance of approximately 8–10 Ω and sometimes varies depending on the transmitter mode in use, a harmonic filter matching circuit 140 matches the outgoing signal to the approximately 50 Ω antenna 155 at the frequency band of interest and filters out first, second, and higher order harmonics of the signal. The matched impedances presented to the power amplifier input and the power amplifier output by the exciter matching circuit 125 and the harmonic filter matching circuit 140 determine the efficiency of the power amplifier.

The transmitted signal is received by a complementary transceiver 190, such as a GSM cellular base station, through an antenna 195. A DCS base station is also compatible with the GSM/DCS radiotelephone 101, and other transceivers would be compatible with PCS, AMPS, or ETACS dual mode radiotelephones. Signals from the base station transceiver 190 are transmitted from the antenna 195 of the base station and received by the antenna 155 of the radiotelephone 101. A duplexer 150 in the radiotelephone 101 controls whether the antenna 155 is transmitting or receiving signals. Received signals are sent through the duplexer 150 to receiver 160. In the receiver 160, a radio frequency (RF) receiver 165 prepares the signal for demodulation, a demodulator 170 demodulates the signal, and a speech decoder 175 decodes the demodulated signal to an audio format for reproduction on speaker 180.

Figure 2:
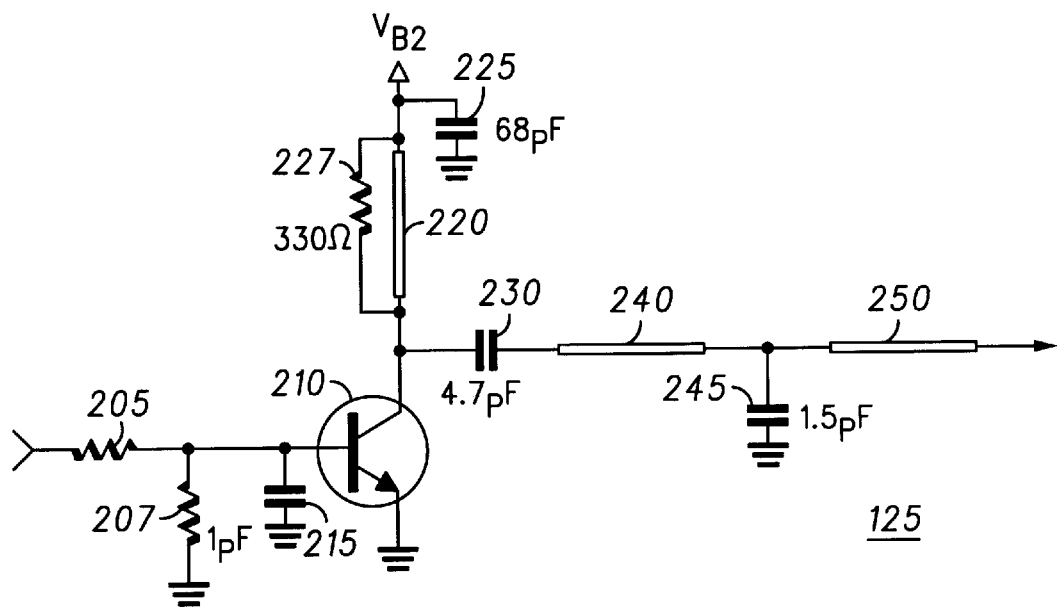
FIG. 2 shows a diagram of the exciter matching circuit according to the preferred embodiment.

FIG. 2 shows a diagram of the exciter matching circuit 125 according to the preferred embodiment. When a GSM signal at 900 MHz emerges from the modulator 120 (shown in FIG. 1), certain components of the exciter matching circuit 125 dominate the impedance response to promote a match to the power amplifier (shown in FIG. 1) at 900 MHz while rejecting other frequencies. Likewise, when a DCS signal at 1800 MHz comes from the modulator 120, different components dominate the impedance response of the exciter matching circuit 125 to create a good match at 1800 MHz while creating a poor match at other frequencies. The modulator 120 is isolated from the power amplifier 130 (shown in FIG. 1) using a resistance buffer with resistor 205 and resistor 207. A 1 pF capacitance 215 is also connected from ground to the base of a BJT 210. The BJT 210 is used to amplify and transform the impedance of a modulated signal before the signal enters the power amplifier 130 (shown in FIG. 1). The output of the BJT is at approximately 50 Ω. A quarter-wave transmission line 220 is connected from the collector of the BJT 210 to a constant voltage source $V_{B2}$. This transmission line 220 acts as an inductor when the modulated signal is at 900 MHz and acts as an open circuit when the modulated signal is at 1800 MHz. A 68 pF capacitance 225 is connected between the voltage source $V_{B2}$ and ground, and a resistor 227 is parallel to the transmission line 220. The resistor 227 stabilizes the BJT by providing a resistive termination when the transmission line 220 acts at an open circuit. A 4.7 pF capacitance 230 is also connected to the collector of the BJT 210, which functions as a direct current (DC) blocking element and as an impedance transforming element at 900 MHz. Two transmission lines 240, 250 connect the signal from the capacitance 230 to the output of the exciter matching circuit 125, which connects to the power amplifier 130 (shown in FIG. 1). Between the two transmission lines 240, 250 is a 1.5 pF capacitance 245 to ground.

During operation, when a 900 MHz GSM modulated signal enters the input to the exciter matching circuit 125, the inductance of the transmission line 220 and capacitance 230 dominate the impedance of the exciter matching circuit 125 to create a good match at 900 MHz at approximately 7 Ω input impedance of the power amplifier 130 (shown in FIG. 1). The other elements in the exciter matching circuit 125 have a negligible effect on the impedance at the 1800 MHz frequency band. In other words, the inductance of the transmission line 220 and the capacitance 230 act as a high pass filter that also transforms lower frequency signals.

When an 1800 MHz DCS modulated signal enters the exciter matching circuit 125, the transmission line 220 is open and the inductance of transmission lines 240, 250 and the capacitance 245 dominate the impedance of the exciter matching circuit 125 to create a good match at 1800 MHz to the approximately 7 Ω input impedance of the power amplifier 130 (shown in FIG. 1). In this case, the transmission line 220 and capacitance 230 have a negligible effect on the impedance at the 900 MHz frequency band. The inductance of the transmission lines 240, 250 and the capacitance 245 act as a low pass filter that also transforms higher frequency signals.

Figure 3:
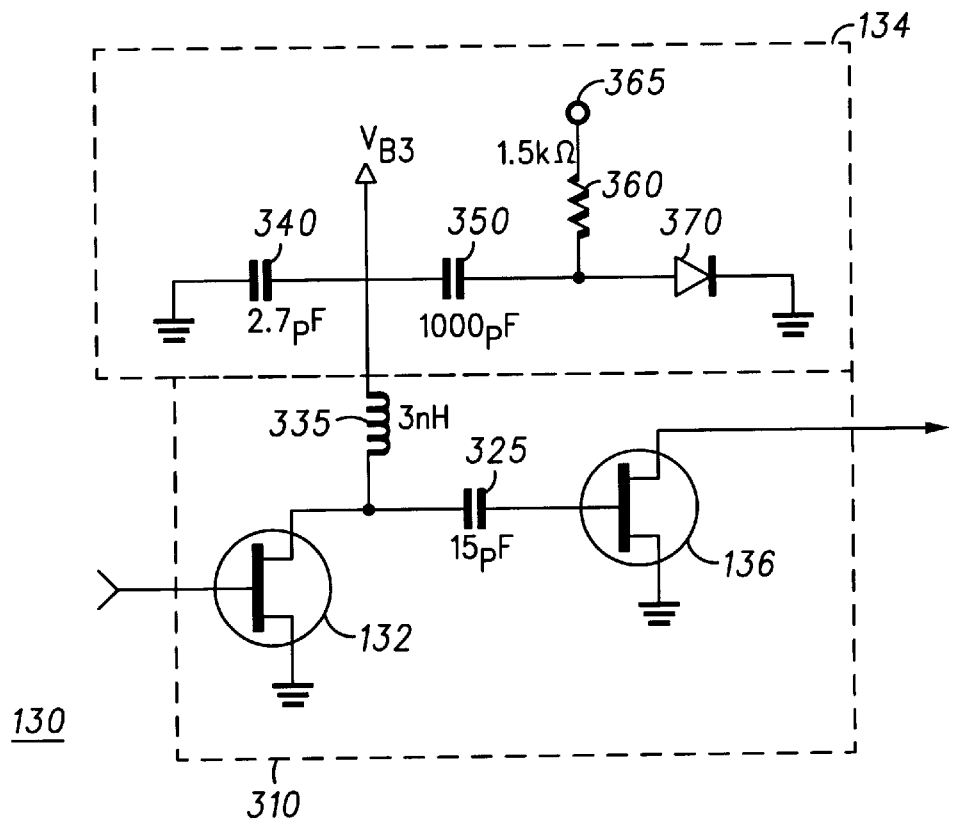
FIG. 3 shows a diagram of the two-stage power amplifier according to the preferred embodiment.

FIG. 3 shows a diagram of the two-stage power amplifier 130 according to the preferred embodiment. An interstage matching circuit 134 matches the impedances between the first stage 132 and the second stage 136 of the two-stage power amplifier 130. The interstage matching circuit 134 optimizes the impedances at 900 MHz or 1800 MHz depending on which transmission mode is in use.

Two metal semiconductor field-effect transistors (MESFETs) are used as power amplifier stages 132, 136 in the power amplifier 130. Alternatives to the MESFETs include silicon BJTs, silicon MOSFETs, and heterojunction bipolar transistors (HBTs). Between the two stages 132, 136 is a 15 pF capacitance 325, and at the source of the first stage 132 is a small 3 pH inductance 335 which is connected to a voltage source $V_{B3}$. The two stages 132, 136, the inductance 335, and the capacitance 325 are integrated onto a chip 310. Outside of the chip 310, a 2.7 pF capacitance 340 is connected between the inductance 335 and the voltage source $V_{B3}$. A 1000 pF capacitance 350 is also connected to the voltage source $V_{B3}$ with a diode 370 connected from the capacitance 350 to ground. A 1.5 kΩ resistor 360 with an input node 365 is connected between the capacitance 350 and the diode 370.

When a voltage source is connected to the input node 365, the diode 370 turns on and the 1000 pF capacitance 350 dominates the impedance of the interstage matching circuit 134. The capacitance values are calculated so that 900 MHz GSM signals from the first stage 132 of the power amplifier 130 are matched to the second stage of the power amplifier 130 (shown in FIG. 1) when the input node 365 is connected to a 2.7 V positive voltage source. When a zero, negative, or floating voltage source is connected to the input node 365, the 2.7 pF capacitance 340 and the 3 nH inductance 335 and the capacitance 350 dominate the impedance of the interstage matching circuit 134 which then matches 1800 MHz DCS signals to the second stage 136 of the power amplifier 130 (shown in FIG. 1). Thus, the voltage source applied to node 365 is a GSM/DCS mode selection voltage. Voltage is applied to node 365 when the radiotelephone 101 is in GSM mode, and voltage is not applied to node 365 when the radiotelephone 101 is in DCS mode.

Figure 4:
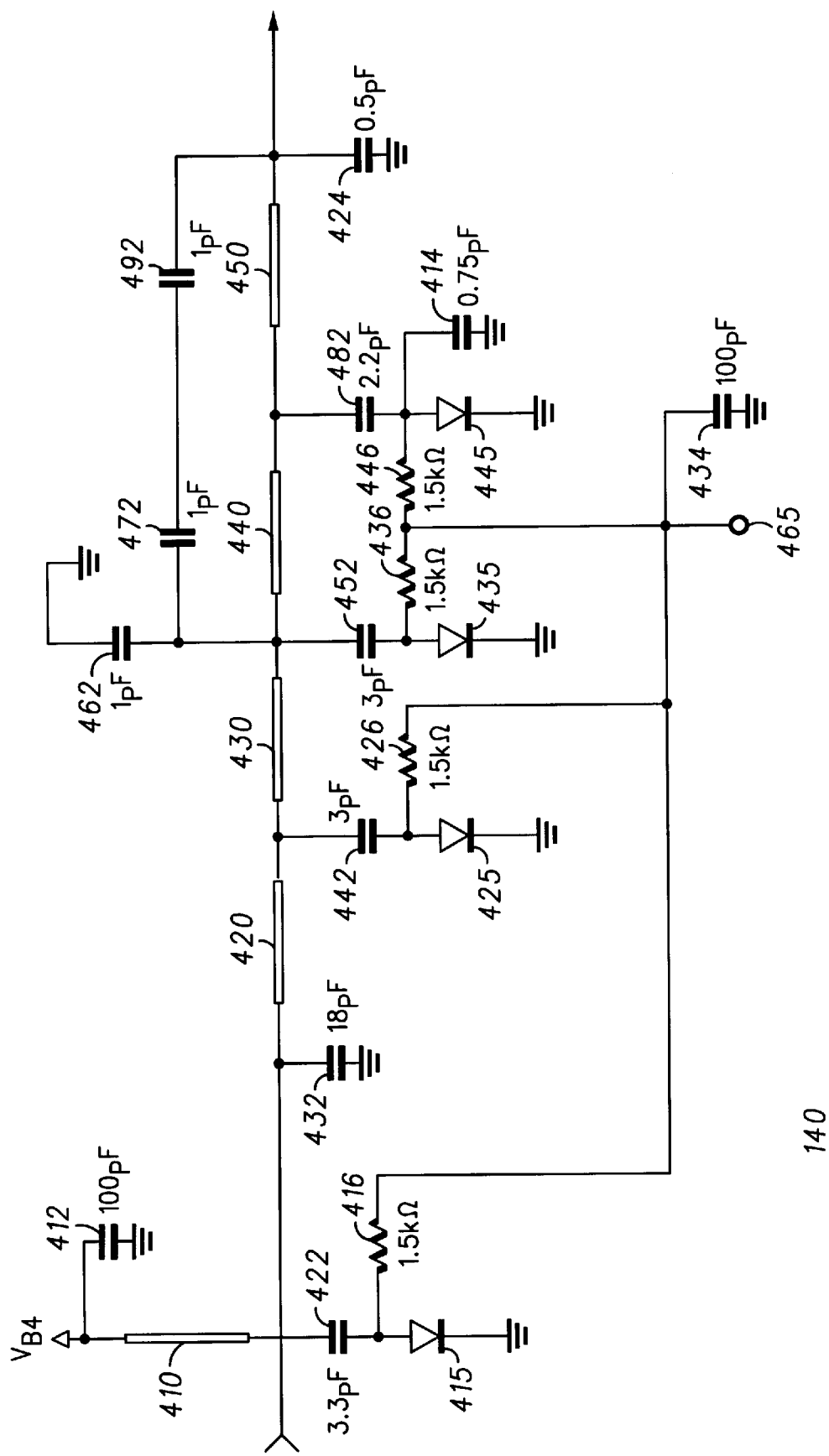
FIG. 4 shows a diagram of the harmonic filter matching circuit according to the preferred embodiment.

FIG. 4 shows a diagram of the harmonic filter matching circuit 140 according to the preferred embodiment. The harmonic filter matching circuit 140 uses both impedance matching and low pass filtering to pass 900 MHz signals and suppress 1800 MHz, 2700 MHz, 3600 MHz, and higher order harmonics during GSM mode transmissions while passing 1800 MHz signals and suppressing 2700 MHz signals and 3600 MHz and higher order harmonics during DCS transmissions.

The output of the power amplifier 130 (shown in FIG. 1) is connected through a first transmission line 410 to a voltage source $V_{B4}$. Transmission line 410 is preferably a half-wave transmission line at 2700 MHz. A 100 pF capacitance 412 is also connected to the voltage source $V_{B4}$. A set of transmission lines 420, 430, 440, 450 is connected in series to the output of the power amplifier 130. At the ends of each transmission line is a connection from an approximately 3 pF capacitance 422, 442, 452, 482 through a diode 415, 425, 435, 445 to ground. The capacitance of each diode 415, 425, 435, 445 when the diode is off adds a fixed parallel capacitance to the switched capacitances 422, 442, 452., 483. An additional 1.8 pF capacitance 432 is connected in parallel to the first capacitance 422 and diode 415 pair.

This structure can be described as a cascade of four low-pass matching sections. The reactance of the first three sections, which include transmission lines 420, 430, 440, are switchable using diodes 415, 425, 435, 435. Between each capacitance and diode pair is a 1.5 kΩ resistor 416, 426, 436, 446 connected to node 465, which controls the switching of the first three sections. A 100 pF capacitance 434 connects the node 465 and ground. Additional 1 pF or less capacitances 462, 472, 492, 414, 424, provide attenuation for the 2700 MHz, 3600 MHz and high order harmonics of the 900 MHz GSM and 1800 MHz DCS signals. The reactance of the final section, which includes transmission line 450, is fixed. This final section suppresses 3600 MHz harmonics generated by the diodes 415, 425, 435, 435 when they are off.

When a 2.7 V positive voltage source is applied to node 465, diodes 415, 425, 435, 445 turn on, and the approximately 3 pF capacitances 422, 442, 452, 482 and the inherent inductance in the diodes 415, 425, 435, 445 filter out 1800 MHz signals. Thus, the GSM/DCS mode selection voltage used for the interstage matching circuit 134 (shown in FIG. 3) can also be used to control the operation of the harmonic filter matching circuit 140. Positive voltage is applied to node 465 when the radiotelephone 101 is in GSM mode, and negative, zero, or floating voltage is applied to node 465 when the radiotelephone 101 is in DCS mode. The operation of the harmonic filter matching circuit 140 provides impedance matching at 900 MHz when the GSM mode is selected via node 465 with signal attenuation at the harmonic frequencies of 1800 MHz, 2700 MHz, and 3600 MHz as well as other high order harmonic frequencies. When the DCS mode is selected, however, the harmonic filter matches at 1800 MHz and provides signal attenuation starting at 2700 MHz as well as 3600 MHz and higher order harmonics.

Figure 5:
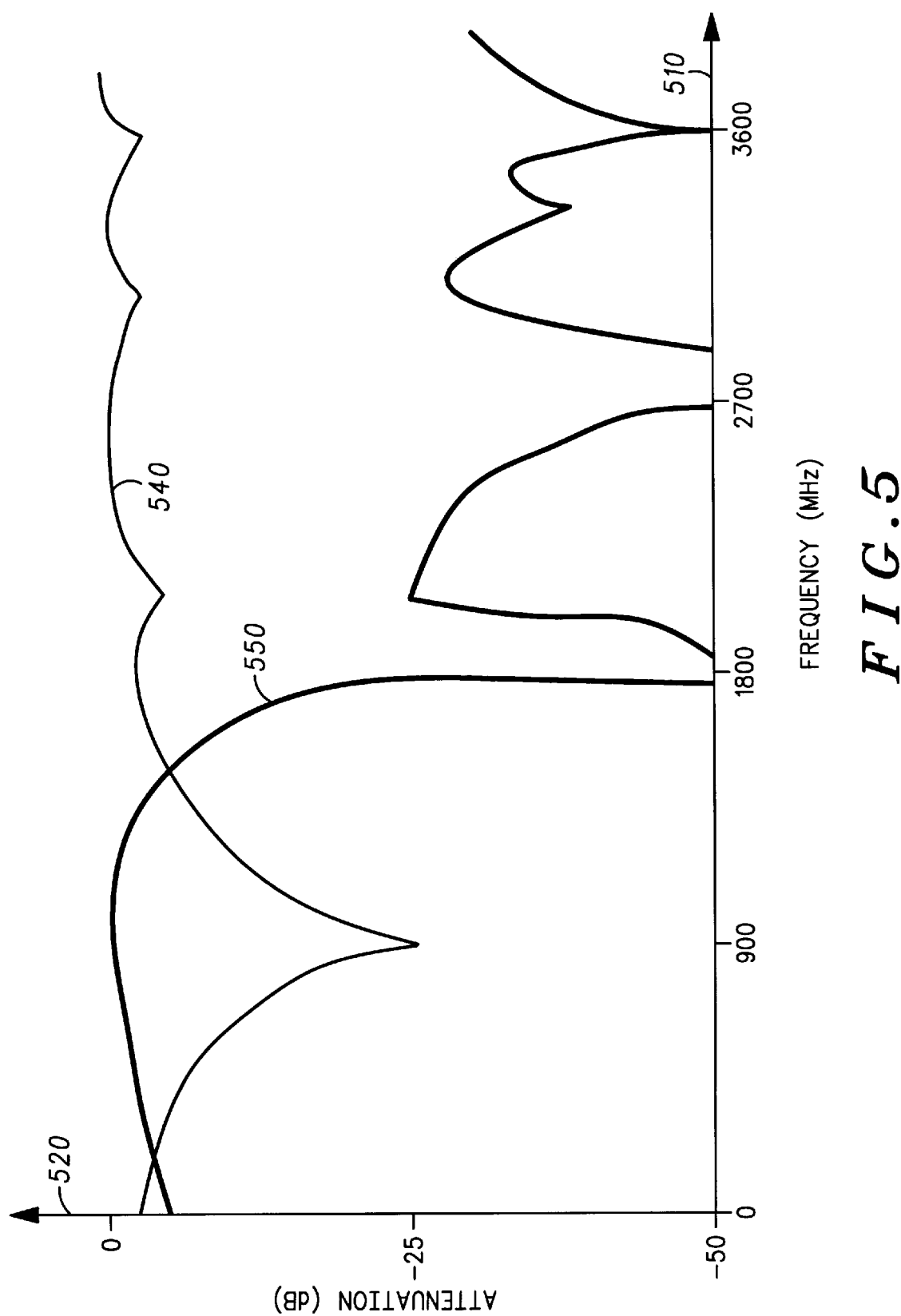
FIG. 5 shows a graph of a return loss signal and an attenuation signal at the output of the harmonic filter matching circuit in GSM mode according to the preferred embodiment.

FIG. 5 shows a graph of a return loss signal 540 and an attenuation signal 550 at the output of the harmonic filter matching circuit 140 (shown in FIG. 1) in GSM mode according to the preferred embodiment. The X-axis 510 of the graph measures frequency in MHz while the Y-axis 520 of the graph measures attenuation in dB. The return loss signal 540 has a significant lowering in return loss signal at 900 MHz, which indicates a good impedance match at the 900 MHz GSM frequency band. Also, at 900 MHz, the attenuation signal 550 is close to 0 dB, which passes the 900 MHz signal at full power. Meanwhile, at 1800 MHz, 2700 MHz, and 3600 MHz, the attenuation signal 550 lowers to dampen harmonics cf the 900 MHz signal.

Figure 6:
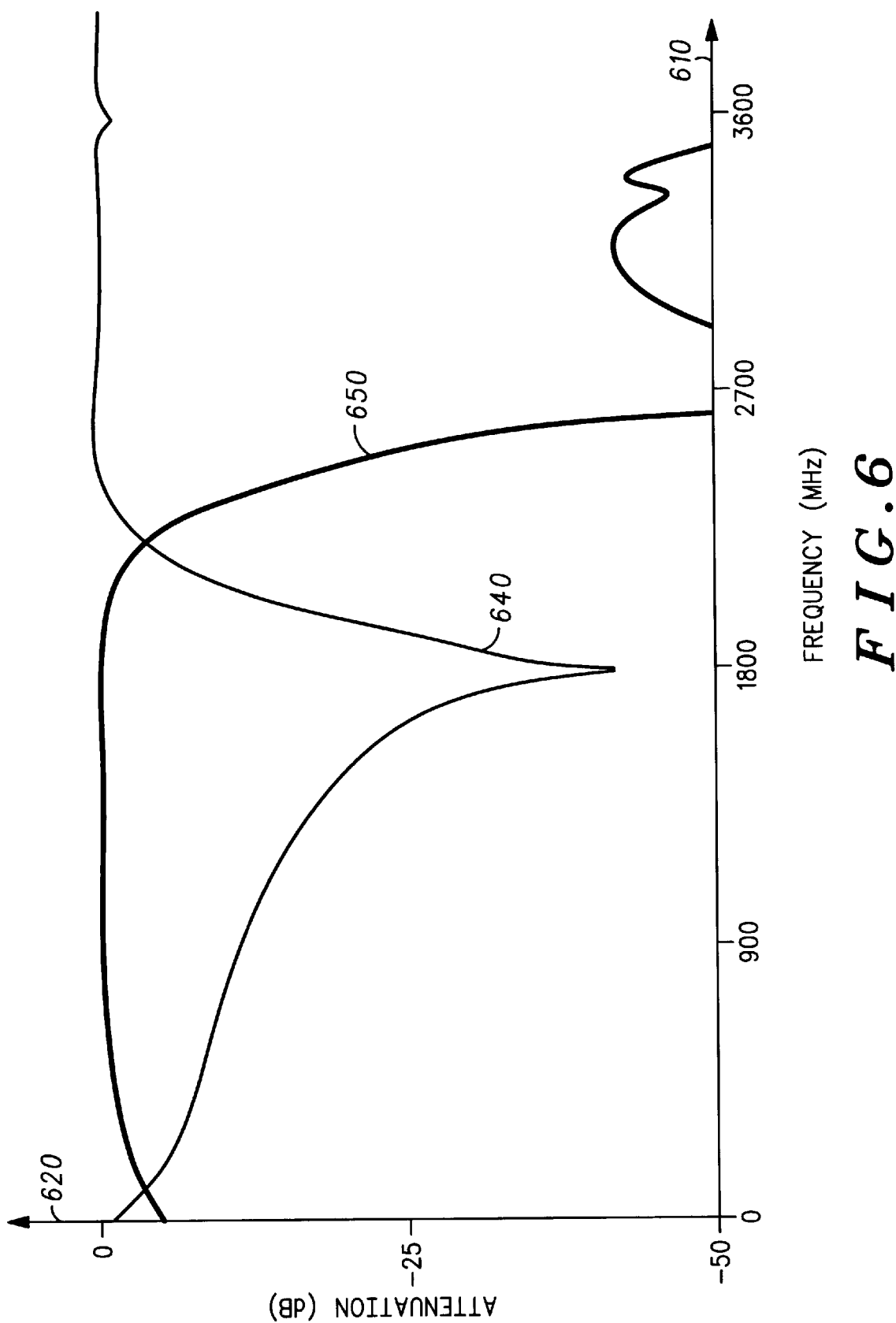
FIG. 6 shows a graph of a return loss signal and an attenuation signal at the output of the harmonic filter matching circuit in DCS mode according to the preferred embodiment.

FIG. 6 shows a graph of a return loss signal 640 and an attenuation signal 650 at the output of the harmonic filter matching circuit 140 (shown in FIG. 1) in DCS mode according to the preferred embodiment. The X-axis 610 of the graph measures frequency in MHz while the Y-axis 620 measures attenuation in dB. The return loss signal 640 has a significant lowering in return loss signal at 1800 MHz, which indicates a good impedance match at the 1800 MHz DCS frequency band. Also, at 1800 MHz, the attenuation signal 650 is close to 0 dB, which is very different than the attenuation signal characteristic for the harmonic filter matching circuit when it is in the GSM mode. The attenuation signal 650 still lowers at 2700 MHz and 3600 MHz to dampen harmonics of the 1800 MHz signal.

Depending on the systems used in the dual mode radiotelephone 101, component values of the exciter matching circuit 125, the interstage matching circuit 134, and the harmonic filter matching circuit 140 can be adjusted to match only at the frequency bands of interest. Also, transmission lines within the three matching circuits can be replaced with inductances to reduce size or to promote fabrication onto an integrated circuit.

The exciter matching circuit uses impedance characteristics to promote matching of the modulator output and the power amplifier input of a dual mode transmitter at more than one frequency band of interest. The matching characteristics within the exciter matching circuit change depending on the frequency band of the input signal. The interstage matching circuit 134 uses a switch to add components, which varies the matching characteristic of the interstage matching circuit between the first stage and the second stage of a two-stage power amplifier depending on the mode used by the dual mode transmitter. The harmonic filter matching circuit 140 also uses switches to add components to vary the matching characteristic and the filter characteristic of the harmonic filter matching circuit between the output of the power amplifier and the input of the antenna depending on the mode used by the dual mode transmitter.

Thus, the three matching circuits use very few additional components to provide matching at more than one frequency band of interest and filter out undesired harmonics for dual mode transmitters dependent upon the mode in use. While specific components and functions of the impedance matching for a dual band power amplifier are described above, fewer or additional functions could be employed by one skilled in the art within the true spirit and scope of the present invention.

We claim:

1. A harmonic filter matching circuit for a power amplifier of a dual band constant envelope modulation communication device selectively operable in a first frequency band and a second frequency band comprising:

a first switchable low-pass matching section, having a first inductance, a first capacitor, and a first switch; and a fixed low-pass matching section, having a fixed inductance and a fixed capacitor, wherein the first switch connects the first capacitor to ground when the first frequency band is selected, and wherein the first switch disconnects the first capacitor from ground when the second frequency band is selected.

2. A harmonic filter matching circuit according to claim 1 wherein the first switch is a first diode coupled between the first capacitance and ground.

3. A harmonic filter matching circuit according to claim 1 wherein the fixed low-pass matching section passes the first frequency band and the second frequency band and attenuates harmonics of the second frequency band.

4. A harmonic filter matching circuit according to claim 1 further comprising:

a second switchable low-pass matching section, coupled between the first switchable low-pass matching section and the fixed low-pass matching section, having a second inductance, a second capacitor, and a second switch, wherein the second switch connects the second capacitor to ground when the first frequency band is selected, and wherein the second switch disconnects the second capacitor from ground when the second frequency band is selected.

5. A harmonic filter matching circuit according to claim 4 wherein the second switch is a second diode coupled between the second capacitance and ground.

6. A dual band transmitter, having a power amplifier with power amplifier input impedances and power amplifier output impedances for power efficient operation in a saturated mode at either a first frequency band or a second frequency band, comprising:

an exciter matching circuit, coupled to an input of the power amplifier, for selectively matching an output impedance of the exciter matching circuit in either the first frequency band or the second frequency band to the power amplifier input impedances; and a harmonic filter matching circuit, coupled to an output of the power amplifier, for selectively matching the power amplifier output impedances in either the first frequency band or the second frequency band to an antenna.

7. A dual band transmitter according to claim 6 wherein the harmonic filter matching circuit comprises:

a first switchable low-pass matching section, having a first inductance, a first capacitor, and a first switch; and a fixed low-pass matching section, having a fixed inductance and a fixed capacitor, wherein the first switch connects the first capacitor to ground when the first frequency band is selected, and wherein the first switch disconnects the first capacitor from ground when the second frequency band is selected.

8. A dual band transmitter according to claim 7 wherein the first switch is a first diode coupled between the first capacitance and ground.

9. A dual band transmitter according to claim 7 wherein the fixed low-pass matching section passes the first frequency band and the second frequency band and attenuates harmonics of the second frequency band.

10. A dual band transmitter according to claim 7 further comprising:

a second switchable low-pass matching section, coupled between the first switchable low-pass matching section and the fixed low-pass matching section, having a second inductance, a second capacitor, and a second switch, wherein the second switch connects the second capacitor to ground when the first frequency band is selected, and wherein the second switch disconnects the second capacitor from ground when the second frequency band is selected.

11. A dual band transmitter according to claim 10 wherein the second switch is a second diode coupled between the second capacitance and ground.

* * * * *